United States Patent
Tsuda

(10) Patent No.: US 6,630,744 B2
(45) Date of Patent: Oct. 7, 2003

(54) MULTICHIP MODULE

(75) Inventor: Hiroyuki Tsuda, Ichinomiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/957,155

(22) Filed: Sep. 20, 2001

(65) Prior Publication Data

US 2002/0033526 A1 Mar. 21, 2002

(30) Foreign Application Priority Data

Sep. 21, 2000 (JP) .......................................... 2000-286322

(51) Int. Cl.⁷ .............................................. H01L 23/48
(52) U.S. Cl. .................... 257/777; 257/784; 257/786; 257/723

(58) Field of Search .................................. 257/777, 784, 257/786, 723

(56) References Cited

U.S. PATENT DOCUMENTS 4,697,095 A * 9/1987 Fujii ............................ 327/408
6,255,736 B1 * 7/2001 Kaneko ........................ 257/777

* cited by examiner

Primary Examiner—David L. Talbott
Assistant Examiner—Luan Thai
(74) Attorney, Agent, or Firm—Fish & Richardson P.C.

(57) ABSTRACT

A small multichip module has a mother chip and a stack chip. The stack chip is stacked on the mother chip. The mother chip includes a first bonding pad located in a circuit area. A bonding pad of the stack chip is wire-bonded with the bonding pad of the mother chip.

15 Claims, 6 Drawing Sheets

MULTICHIP MODULE

BACKGROUND OF THE INVENTION

The present invention relates to multichip modules that have stacked semiconductors, and, more particularly, to multichip modules that have stacked semiconductor chips including analog cells formed in lower chips.

Integrating a number of different circuits forms a multifunctional semiconductor integrated circuit. To further increase the functions of the semiconductor integrated circuit, a semiconductor chip (hereinafter referred to as a "stack chip") is stacked on another semiconductor chip (hereinafter referred to as a "mother chip"). This circuit arrangement is referred to as a "multichip module". More specifically, a plurality of chips with different functions are stacked to form the multichip module, thus reducing the surface area of the multichip module. This arrangement also reduces the number of the chips that are packaged on a substrate, thus lowering the manufacturing cost.

A conventional multichip module includes a mother chip and a stack chip. The mother chip has a computation circuit including analog and digital circuits and a control circuit for controlling an electronic device. The stack chip is stacked on the mother chip and functions as a dynamic random access memory (DRAM) for storing data for the control circuit.

Generally, the mother chip includes an analog cell and a digital cell. The analog cell generally refers to a circuit using analog signal data and includes, for example, a phase lock loop (PLL), an analog/digital converting circuit, a digital/analog converting circuit, and a phase comparison circuit. The digital cell generally refers to a circuit using digital signal data and includes a computation circuit including various logic circuits and a memory. Since the digital circuit operates in accordance with a digital signal, the circuit is relatively resistant to noise. Further, since the digital circuit is operable even if the signal is relatively weak, the operation speed of the circuit is increased and the power consumption is lowered. A general electronic device, such as a CD player and a display, is controlled by using an analog signal (for example, controlling motor torque of a CD player). Thus, a control circuit for controlling the electronic device receives an analog signal as an input signal and generates an analog signal as an output signal. More specifically, the control circuit receives the analog signal and converts the signal to a digital signal for various computation processes. After the processes, the control circuit converts the digital signal to an analog signal, or an output signal. Accordingly, the control circuit must be provided with a number of semiconductor chips that have both analog and digital circuits.

FIGS. 1A and 1B are respectively a plan view and a cross-sectional view showing a prior art multichip module 100. A mother chip 101 includes a substrate 102 and a circuit area 103 formed on the substrate 102. The circuit area 103 includes analog cells 104 and a digital cell 105. The digital cell 105 is separate from the analog cells 104. An I/O cell area 106 is located at the periphery of the mother chip 101 and includes a plurality of input/output cells (I/O cells) 123. A signal is transferred between each I/O cell 123 and an external device. In other words, the I/O cell area 106 is formed by a group of I/O cells 123.

Each I/O cell 123 includes a wire connected to a certain circuit of a corresponding analog or digital cell 104, 105, a buffer transistor 107, and a bonding pad 108 connected to the external device. The buffer transistor 107 amplifies (buffers) a relatively weak signal for an internal circuit of the mother chip 101 and protects the circuit from noise caused by external signals. The size of the buffer transistor 107 is extremely large, for example, several hundreds of times as large as that of a component of the circuit area 103. The bonding pad 108 of each I/O cell 123 is an electrode with which the I/O cell 123 is wire-bonded with a lead frame (not shown). All signals transferred between the multichip module 100 and an external circuit pass through the I/O cell area 106.

An insulating layer 109 is applied to the circuit area 103. A stack chip 110 is mounted on the insulating layer 109 and includes bonding pads 111. Each bonding pad 111 is connected to the corresponding bonding pad 108 of the I/O cell area 106 through a wire 112. The stack chip 110 is thus connected to a certain circuit of the circuit area 103.

For example, one of the analog cells 104 of FIG. 2 receives a digital signal from the digital cell 105 and converts the signal to an analog signal (which indicates voltage or current). The analog cell 104 then sends the analog signal to an external device through the corresponding I/O cell 123. Impedance between circuits and signal delay are adjusted such that the external device accurately receives the analog signal. Further, the length and the lateral dimension of each wire 124, 126 are optimized for this purpose.

If any wire 112 of the stack chip 110 crosses the corresponding analog cell 104 or the corresponding wires 124, 126, noise due to the electric field generated by the wire 112 affects the analog cell 104. This may hinder the operation of the analog cell 104 or change its characteristics. Normally, the stack chip 110 is connected to the digital cell 105 through the corresponding I/O cells 123, the wires 112, and wires 125. Accordingly, noise caused by each wire 125 also affects the analog cell 104.

As a result, the analog cells 104 of the multichip module 100 are separately located at corresponding corners of the circuit area 103, as shown in FIG. 1. This prevents the wires 112 from crossing the analog cells 104 or the wires 124, 126.

However, if the analog cells 104 must be located on the mother chip 101 to avoid interfering with the wires 112, which connect the stack chip 110 to the I/O bus (the I/O cell area 106), the design of the mother chip 101 becomes complicated. Particularly, if the circuit area 103 must receive a relatively large, inseparable analog cell, a multichip module becomes infeasible. Accordingly, there is a need for a simpler mother chip design.

Further, each bonding pad 111 of the stack chip 110 is normally connected to a certain circuit of the mother chip 101 and is not connected to an external circuit such as a power source through the corresponding bonding pad 108. However, to prevent the wires 112 from interfering with one another, the wires 112, which are connected to the corresponding bonding pads 108 in the I/O bus, must be separated from one another at substantially equal angular intervals. This increases the area of the I/O bus.

In addition, the I/O cell area 106 is formed at the periphery of the multichip module 100 to ensure a sufficient space for aligning the I/O cells 123. It is thus impossible to reduce the I/O cell area 106 over a certain extent. Accordingly, even if the circuit area 103 is minimized, the area of the mother chip 101 cannot be reduced sufficiently.

BRIEF SUMMARY OF THE INVENTION

Accordingly, it is an objective of the present invention to provide a multichip module that is easy to design and has a reduced area.

To achieve the foregoing and other objectives and in accordance with the purpose of the present invention, the invention provides a multichip module that has first and second semiconductor chips. The first semiconductor chip has a circuit area and at least one bonding pad located in the circuit area. The second semiconductor chip is located on the first semiconductor chip and has at least one bonding pad that is wire-bonded with the bonding pad of the first chip.

The present invention includes a multichip module that has first and second semiconductor chips. The first semiconductor chip includes a circuit area and first and second I/O cell groups. The first I/O cell group is located outside the circuit area and has a plurality of I/O cells. The second I/O cell group is located in the circuit area and has a plurality of I/O cells. The second semiconductor chip is located on the first semiconductor chip and is connected at least to the I/O cells of the second I/O cell group.

The present invention further includes a multichip module that has first and second semiconductor chips. The first semiconductor chip includes a circuit area and at least one bonding pad located in the circuit area, and the first semiconductor chip includes an analog cell and a digital cell located in the circuit area. The bonding pad of the first chip is located between the analog cell and the digital cell. The second semiconductor chip is superimposed on the digital cell of the first semiconductor chip. The second semiconductor chip has at least one bonding pad that is wire-bonded with the bonding pad of the first chip.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1A:
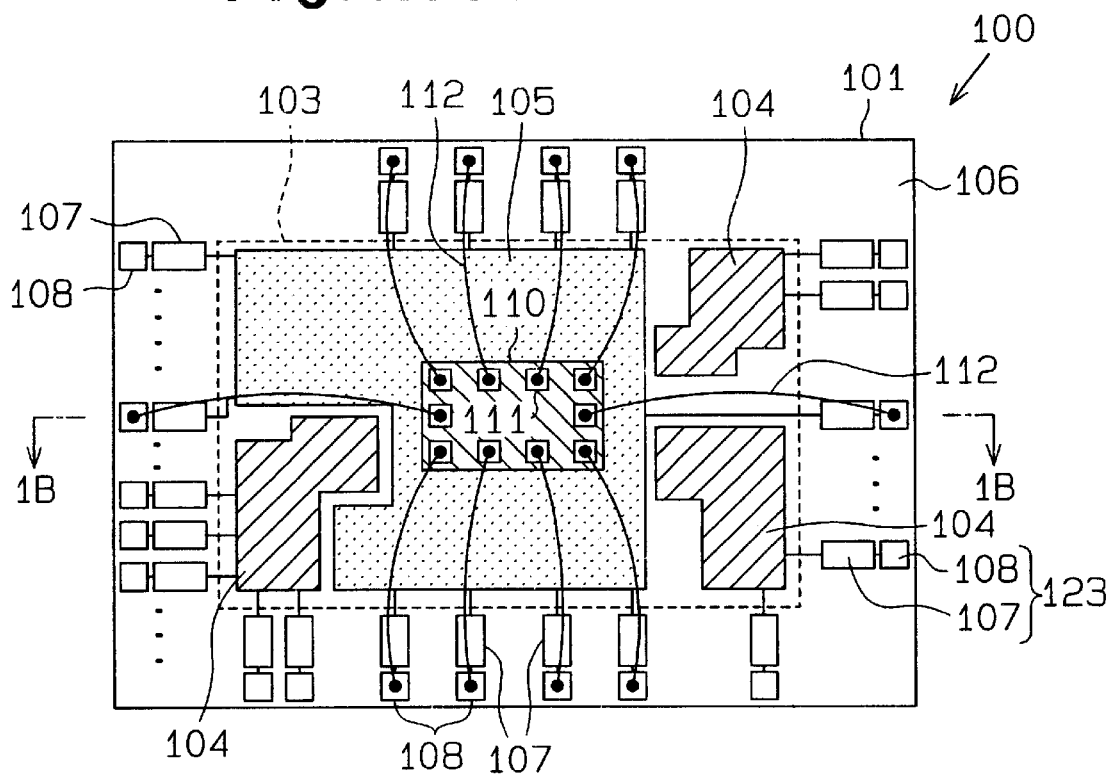
FIG. 1A is a plan view showing a prior art multichip module.
Figure 1B:
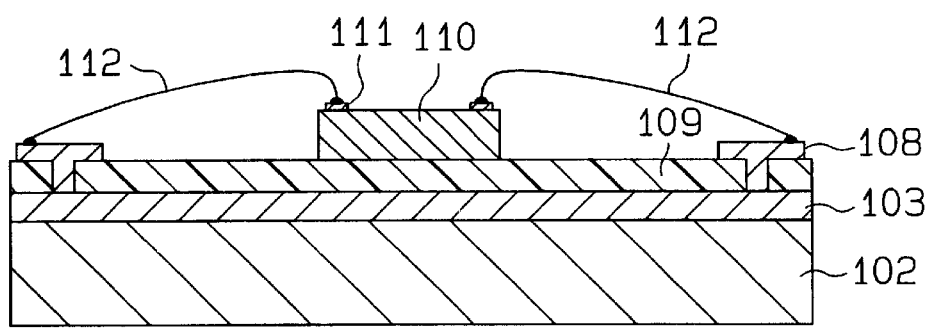
FIG. 1B is a cross-sectional view showing the multichip module of FIG. 1A.
Figure 2:
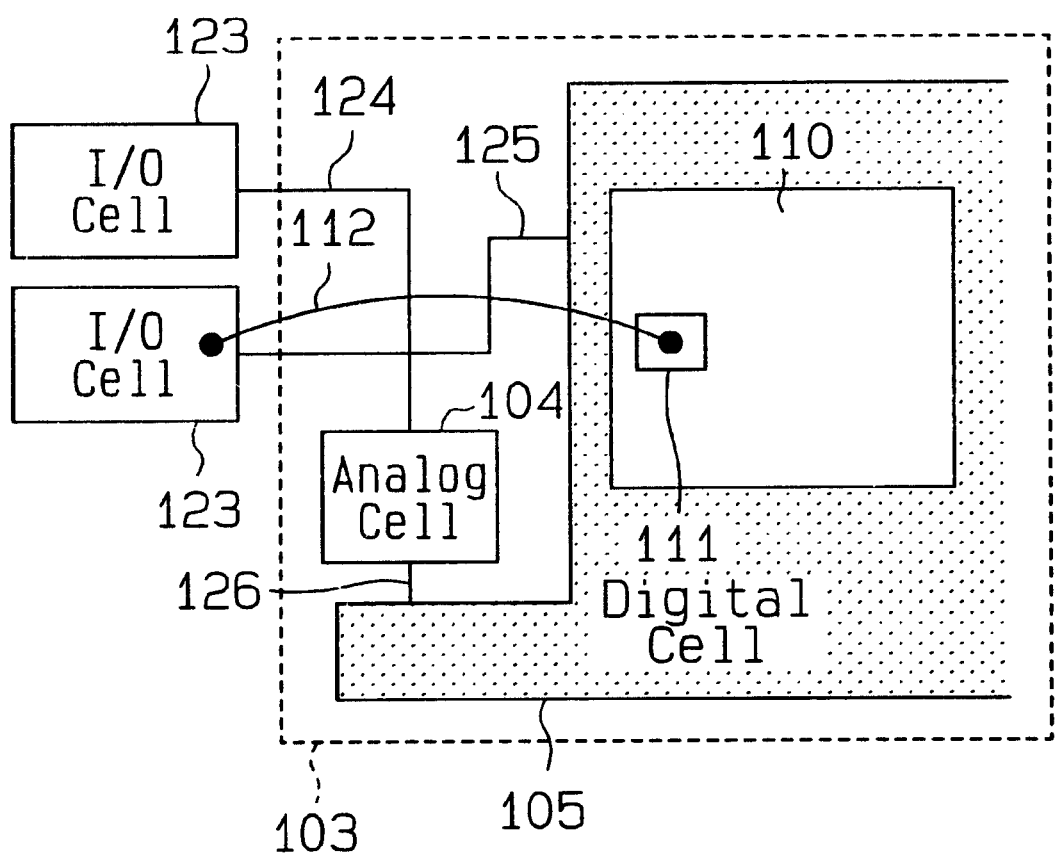
FIG. 2 is an enlarged cross-sectional view showing a portion of the multichip module of FIG. 1A.
Figure 3A:
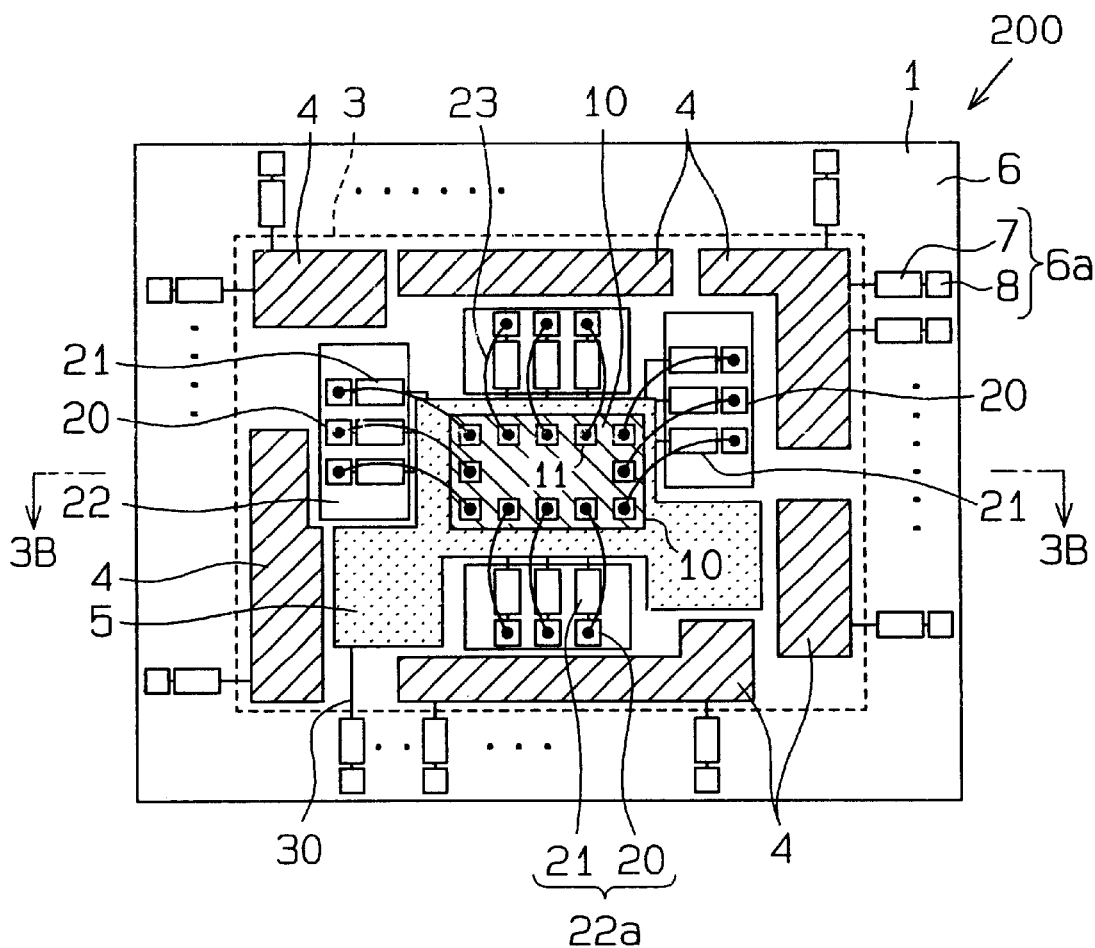
FIG. 3A is a plan view schematically showing a multichip module of a first embodiment according to the present invention.
Figure 3B:
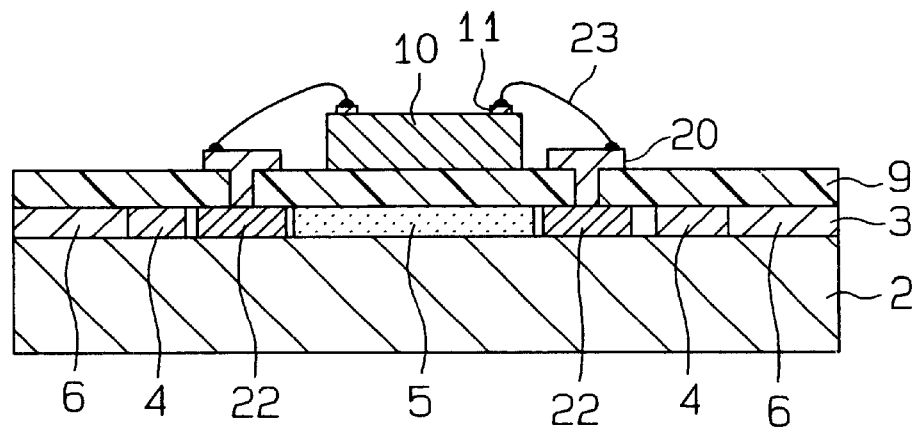
FIG. 3B is a cross-sectional view showing the multichip module of FIG. 3A.

FIGS. 3A and 3B show a multichip module 200 of a first embodiment according to the present invention. The multichip module 200 includes a mother chip 1. The mother chip 1 has a substrate 2 and a circuit area 3 formed on the substrate 2. The circuit area 3 includes analog cells 4 and a digital cell 5. The digital cell 5 is separate from the analog cells 4. An I/O cell area (an I/O bus) 6 is formed at the periphery of the mother chip 1. A signal is transferred between the I/O cell area 6 and an external device.

The I/O cell 6 includes a plurality of outer I/O cells 6a. Each outer I/O cell 6a has a wire connected to a certain circuit of the corresponding analog or digital cell 4, 5, a buffer transistor 7, and a bonding pad 8. The bonding pad 8 of each outer I/O cell 6a connects the outer I/O cell 6a to an external device. An insulating layer 9 is applied to the circuit area 3, and a stack chip 10 is located on the insulating layer 9. The stack chip 10 includes a plurality of bonding pads 11. In the first embodiment, the multichip module 200 is a control circuit for controlling an electronic device, and the stack chip 10 is a digital circuit, which uses digital circuit signals, such as a DRAM.

A plurality of inner I/O cells 22a are formed in the circuit area 3. Each inner I/O cell 22a includes a bonding pad 20 and a buffer transistor 21. The inner I/O cells 22a are divided into a plurality of inner I/O cell groups 22. The inner I/O cell groups 22 are located around the stack chip 10 at predetermined intervals. Each bonding pad 20 is connected to a corresponding bonding pad 11 of the stack chip 10 through a wire 23.

As described, the inner I/O cell groups 22 are located in the circuit area 3, thus reducing the number of the outer I/O cells 6a located in the outer I/O cell area 6. The area of the outer I/O cell area 6 is thus decreased. Accordingly, the area of the mother chip 1, or the area of the multichip module 200, becomes relatively small, as compared to the prior art multichip module 100.

Figure 4:
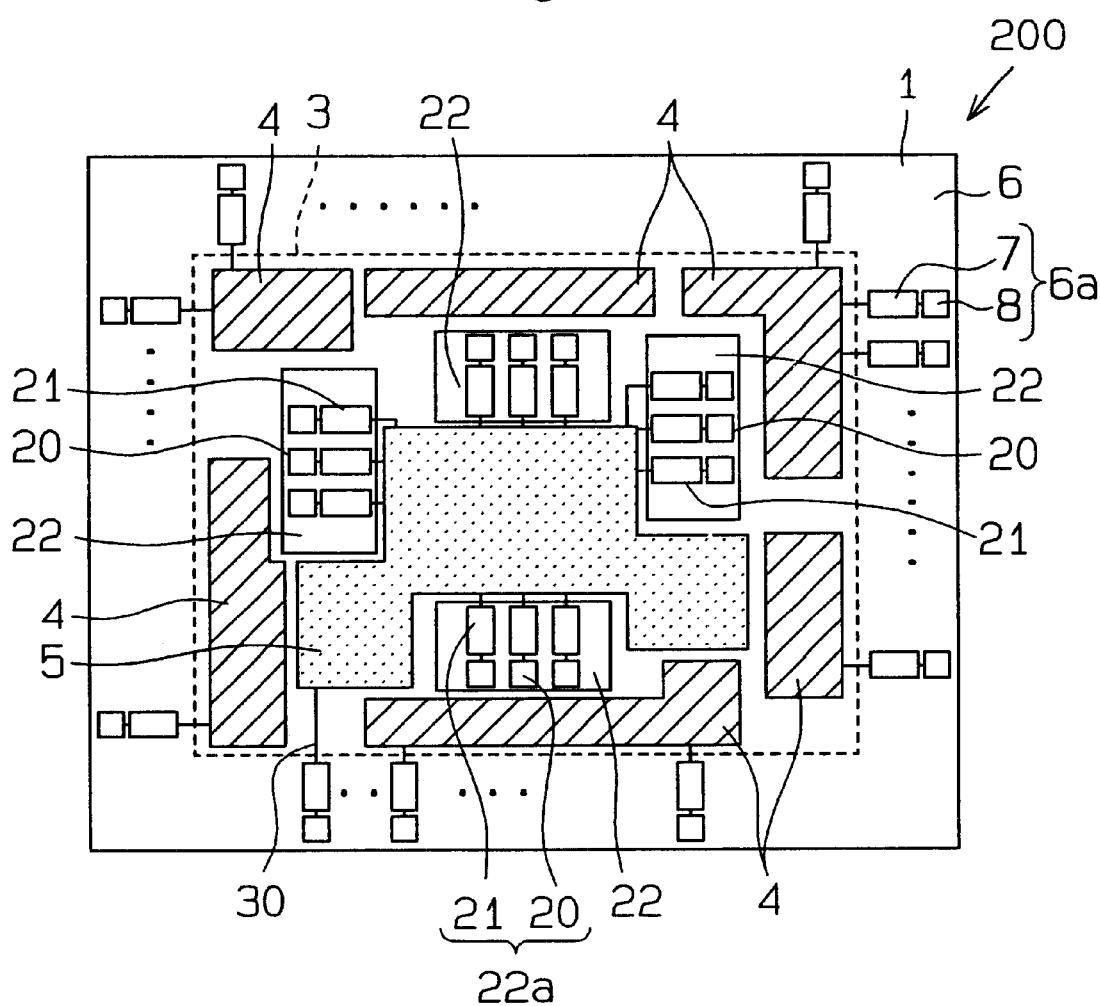
FIG. 4 is a plan view showing a mother chip of the multichip module of FIG. 3A.

The circuit arrangement of the mother chip 1 of the multichip module 200 will hereafter be described. FIG. 4 shows the circuit arrangement of the mother chip 1 without the stack chip 10 or the wires 23.

The digital cell 5 is located as one body substantially in the middle of the circuit area 3. The analog cells 4 are located at the periphery of the circuit area 3, or between the outer I/O cell area 6 and the digital cell 5. Each inner I/O cell group 22 is located between the corresponding analog cell 4 and the digital cell 5. The stack chip 10 is superimposed on the digital cell 5 and is connected to the digital cell 5 through the wires 23 (see FIG. 3A). The area of the middle of the digital cell 5 is large enough to receive the stack chip 10.

As described, each inner I/O cell group 22 is located between the corresponding analog cell 4 and the digital cell 5, and the stack chip 10 is superimposed on the digital cell 5. Accordingly, none of the wires 23 that connect the corresponding inner I/O cell 22a to the stack chip 10 crosses an analog cell 4. Further, none of the wires 23 crosses a wire 30, which connects one of the outer I/O cells 6a to the digital cell 5.

The stack chip 10, or the DRAM, stores data for computation circuits of the multichip module 200 and is connected to the digital cell 5. Accordingly, only digital data is transferred between the stack chip 10 and the mother chip 1. That is, no analog data is transferred between the stack chip 10 and the mother chip 1. However, it is preferred that the inner I/O cell groups 22 are located between the analog cells 4 and the digital cell 5, instead of being surrounded by the digital cell 5. More specifically, if the digital cell 5 were located to surround the inner I/O cell groups 22, wires that connect components of the digital cell 5 located on opposite sides of one of the inner I/O cell groups 22 must be routed around the inner I/O cell group 22. This arrangement requires relatively long wires. Further, since a typical CAD software program can not optimize the bypassing wire arrangement, the arrangement must be designed manually, thus lowering efficiency. However, if the inner I/O cell groups 22 are located between the analog cells 4 and the digital cell 5, such wire routing becomes unnecessary. That is, the circuit arrangement in the digital cell 5 can be optimized easily using CAD software.

It is preferred that the stack chip 10 is superimposed on the digital cell 5. More specifically, noise due to the electric field and magnetic field caused by the operation of the stack chip 10 affects the analog cells 4. However, since the digital cell 5 operates in accordance with digital data, the noise hardly affects the digital cell 5.

The buffer transistor 21 of each inner I/O cell 22a may be minimized, as compared to the buffer transistor 7 of each outer I/O cell 6a. More specifically, each buffer transistor 7 transfers a signal between the corresponding outer I/O cell 22a and an external device of the mother chip 1 and must have a relatively high drive performance. In contrast, each buffer transistor 21 transfers a signal between the corresponding inner I/O cell 22a and the stack chip 10, which is an internal device of the multichip module 200. Thus, the buffer transistor 21 may have a relatively low drive performance. Further, as compared to a wire that connects the I/O cell area 6 to the external device, each wire 23 that connects the mother chip 1 to the stack chip 10 is less likely to pick up noise that can damage a circuit. Accordingly, even if each buffer transistor 21 is minimized, the buffer transistor 21 functions as a protective component. In addition, the area of each inner I/O cell 22a is less than the area of each outer I/O cell 6a. As a result, the total area of inner I/O cells 22a and the outer I/O cells 6a is less than the area of the I/O cell area 106 of the prior art multichip module 100.

It is preferred that the buffer transistor 21 of each inner I/O cell 22a is located near the digital cell 5 and that the bonding pad 20 of the inner I/O cell 22a is located near the corresponding analog cell 4. That is, each wire 23 that connects the stack chip 10 to the corresponding bonding pad 20 extends above the corresponding buffer transistor 21. More specifically, the stack chip 10, or the DRAM, is connected to the digital cell 5 through the buffer transistors 21. Thus, if the buffer transistors 21 are located near the digital cell 5, the length of the wire between each buffer transistor 21 and the digital cell 5 is short.

Figure 5A:
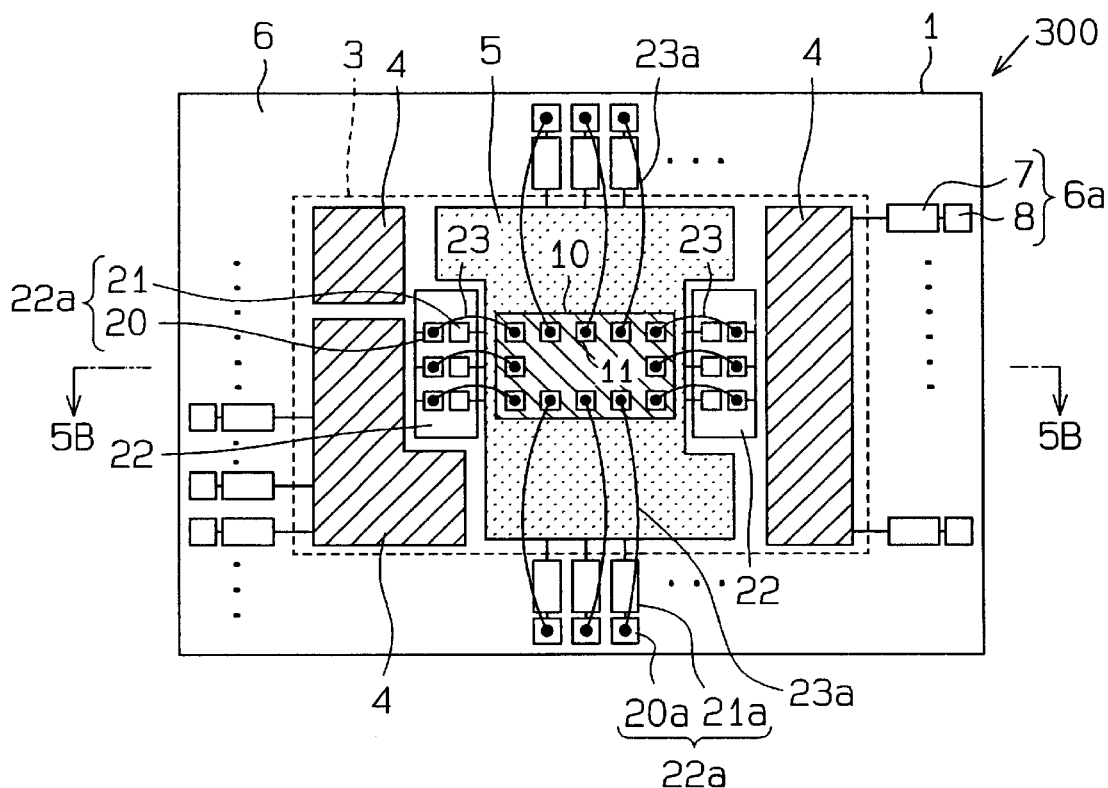
FIG. 5A is a plan view schematically showing a multichip module of a second embodiment according to the present invention.
Figure 5B:
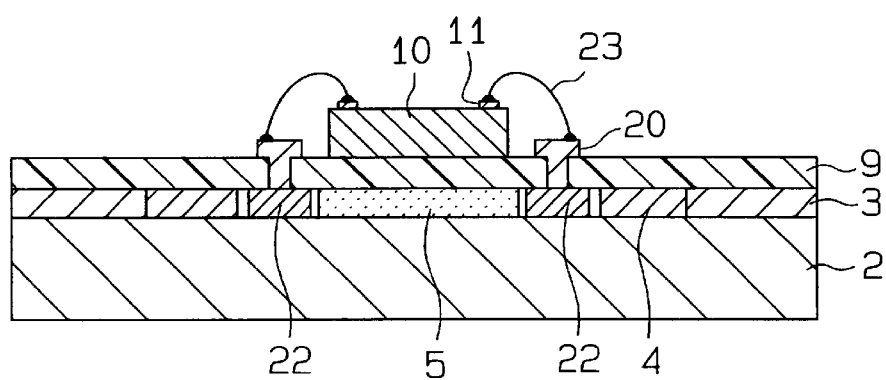
FIG. 5B is a cross-sectional view showing the multichip module of FIG. 5A.

FIGS. 5A and 5B show a multichip module 300 of a second embodiment according to the present invention. Same or like reference numerals are given to parts in FIGS. 5A and 5B that are the same as or like corresponding parts of the first embodiment.

In the multichip module 300, a pair of inner I/O cell groups 22 are located at opposite sides, or the right and left sides as viewed in FIG. 5A, of a stack chip 10. The remaining sides, the upper and lower sides, of the stack chip 10 do not face any inner I/O cell groups 22. This arrangement is preferable when a digital cell 5 has a relatively large area, as compared to the digital cell 5 of the first embodiment.

Bonding pads 20a and buffer transistors 21a are located in an outer I/O cell area 6. The stack chip 10 is connected to each bonding pad 20a through a wire 23a. The stack chip 10 is also connected to the digital cell 5 through each buffer transistor 21a. The stack chip 10 is further connected to the bonding pad 20 of each inner I/O cell 22a through a wire 23 and to the digital cell 5 through each buffer transistor 21.

In the second embodiment, the area of each inner I/O cell group 22 is relatively small. Accordingly, a circuit area 3 may be minimized while enlarging the area of each analog cell 4 and that of the digital cell 5. Further, the inner I/O cells 22a are located in the corresponding inner I/O cell groups 22 and I/O cells 22b are located in the outer I/O cell area 6. This arrangement of the I/O cells 22a, 22b optimizes the area of the circuit area 3 and the area of the I/O cell area 6. The area of the mother chip 1 is thus minimized.

In the first and second embodiments, the position of each inner I/O cell group 22 may be changed as desired.

Figure 6:
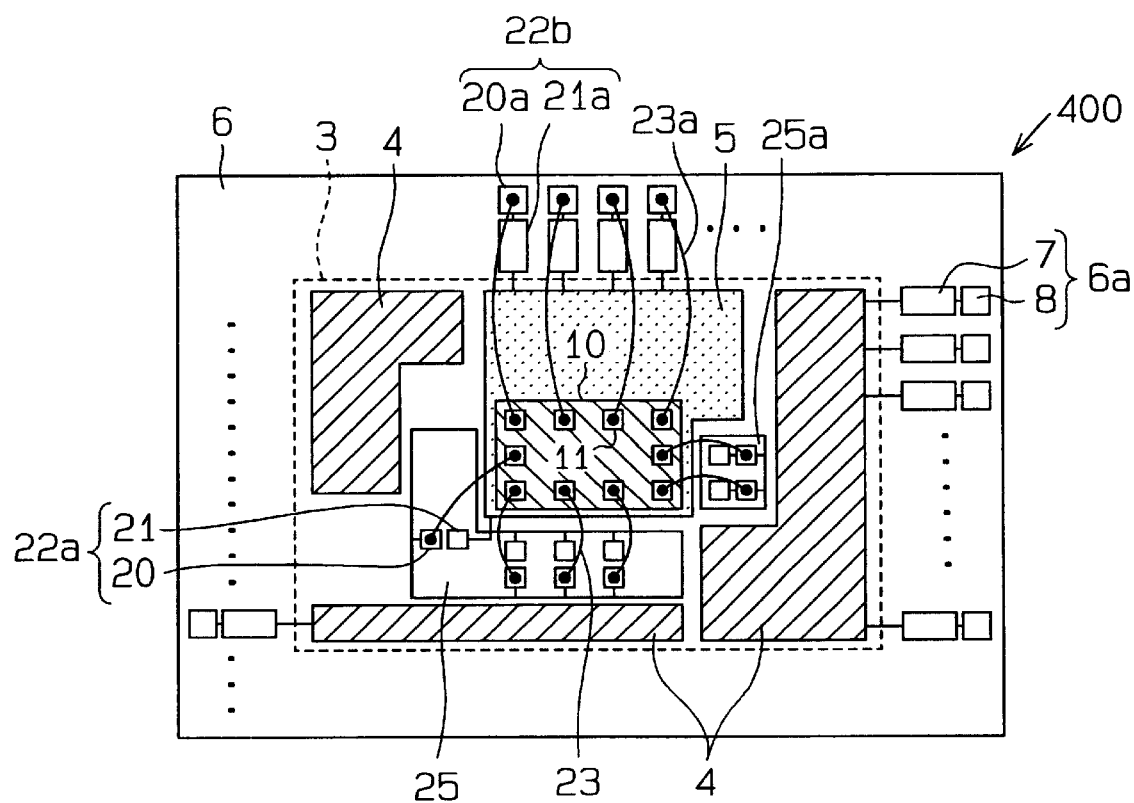
FIG. 6 is a plan view schematically showing a multichip module of a third embodiment according to the present invention.

For example, FIG. 6 shows a multichip module 400 of a third embodiment according to the present invention. As shown in FIG. 6, an inner I/O cell group 25 is located along a pair of continuous sides of the stack chip 10. Further, an inner I/O cell group 25a is located along a different side of the stack chip 10. In addition, I/O cells 22b are located in an outer I/O cell area 6 and inner I/O cells 22a are located in the corresponding inner I/O cell groups 25, 25a. The stack chip 10 is connected to each I/O cell 22a and each I/O cell 22b.

As described, the multichip modules 200, 300, 400 of the first to third embodiments have the following advantages.

At least some bonding pads of the mother chip 1, or the bonding pads 20, are located in the circuit area 3. This reduces the area of the I/O bus (the I/O cell area 6) and shortens the outer dimension of the mother chip 1. The multichip modules 200 to 400 are thus minimized.

Since the wires 23 do not reach the outer I/O cell area 6, the arrangement of the analog cells 4 is less restricted than the prior art. Accordingly, design of the analog cells 4 is relatively simple.

Each bonding pad 20 is located between the corresponding analog cell 4 and the digital cell 5. Thus, as compared to a case in which bonding pads are surrounded by the analog cell 4 or the digital cell 5, the length of the wire is reduced. Further, the circuit arrangement is automatically optimized using CAD software.

The stack chip 10 is superimposed on the digital sell 5 of the mother ship 1. This prevents noise generated by the operation of the stack chip 10 from affecting the analog cells 4.

The buffer transistors 21 of each inner I/O cell 22a in the circuit area 3 are smaller than the buffer transistors 7 of the outer I/O cells 6a, which are located at the periphery of the mother chip 1. The mother chip 1 is thus further minimized.

The present examples and embodiments are to be considered as illustrative and not restrictive and the invention is not to be limited to the details given herein, but may be modified within the scope and equivalence of the appended claims.

What is claimed is:

1. A multichip module comprising:
   a first semiconductor chip including a circuit area and at least one bonding pad located in the circuit area, and
   a second semiconductor chip located on the first semiconductor chip, wherein the second semiconductor chip has at least one bonding pad that is wire-bonded with the bonding pad of the first chip, wherein the first semiconductor chip includes an analog cell and a digital cell located in the circuit area, and the bonding pad of the first chip is located between the analog cell and the digital cell.

2. The multichip module as set forth in claim 1, wherein the second semiconductor chip is superimposed on the digital cell.

3. A multichip module comprising:
- a first semiconductor chip including a circuit area and first and second I/O cell groups, wherein the first I/O cell group is located outside the circuit area and has a plurality of I/O cells, and the second I/O cell group is located in the circuit area and has a plurality of I/O cells; and
- a second semiconductor chip loaned on the first semiconductor chip, wherein the second semiconductor chip is connected at least in the I/O cells of the second I/O cell group, wherein, the first semiconductor chip includes an analog cell and a digital cell located in the circuit area, and the I/O cells of the second I/O cell group are located between the analog cell and the digital cell.

4. The multichip module is set forth in claim 3, wherein the second semiconductor chip is superimposed on the digital cell.

5. The multichip module as set forth in claim 4, wherein each I/O cell of the first I/O cell group has a buffer transistor, each I/O cell of the second I/O cell group has a buffer transistor, and the buffer transistors of the second I/O cells are smaller than the buffer transistors of the first I/O cells.

6. A multichip module comprising:
- a first semiconductor chip including a circuit area and first and second I/O cell groups, wherein the first I/O cell group is located outside the circuit area and has a plurality of I/O cells, and the second I/O cell group is located in circuit area and has a plurality of I/O cells, and
- a second semiconductor chip located on the first semiconductor chip, wherein the second semiconductor chip is connected at least to the I/O cells of the second I/O cell group, wherein the circuit area has an analog cell and a digital cell, and at least one I/O cells is located between the analog cell and the digital cell within the circuit area.

7. A multichip module comprising:
- a first semiconductor chip including a circuit area and at least one bonding pad located in the circuit area, wherein the first semiconductor chip includes an analog cell and a digital cell located in the circuit area, and the bonding pad of the first chip is located between the an analog cell and the digital cell; and
- a second semiconductor chip superimposed on the digital cell of the first semiconductor chip, wherein the second semiconductor chip has at least one bonding pad that is wire-bonded with the bonding pad of the first chip.

8. The multichip module as set forth in claim 7, wherein the second semiconductor chip comprising a digital circuit.

9. The multichip module as set forth in claim 7, wherein the second semiconductor ship comprises a DRAM.

10. A multichip module comprising:
- a first semiconductor chip including a circuit arcs, an analog cell, a digital cell and first and second I/O cell groups, wherein tire analog cell and the digital cell are located in the circuit area, the first I/O cell group is located outside the circuit area and has a plurality of I/O cells, and the second I/O cell group is located in the circuit area and has a plurality of I/O cells, the I/O cells of the second I/O cell group being located between the analog cell and the digital cell, and each I/O cell of the second I/O cell group has a buffer transistor arranged in the proximity of the digital cell, and
- a second semiconductor chip superimposed on the digital cell of the first semiconductor chip, wherein the second semiconductor chip is connected at least to the I/O cells of the second I/O cell group.

11. The multichip module of claim 10, wherein the second semiconductor chip comprises a digital circuit.

12. The multichip module of claim 10, wherein the second semiconductor chip comprises a DRAM.

13. A multichip module comprising:
- a first semiconductor chip including a circuit area, an analog cell, a digital cell, and first and second I/O cell groups, wherein the analog cell and the digital cell are located in the circuit area, the first I/O cell creep is located outside the circuit area and has a plurality of I/O cells, and the second I/O cell group is located in the circuit area and has a plurality of I/O cells, wherein the I/O cells of the second I/O cell group are located between the analog cell and the digital cell;
- a second semiconductor chip superimposed on the digital cell of the first semiconductor chip, wherein the second semiconductor chip includes a third I/O cell group having a plurality of I/O cells;
- a first wire for connecting at least one I/O cells of the third I/O cell group to the at least one I/O cells of the first I/O cell groups, wherein the first wire crosses over the digital cell of the first semiconductor chip; and
- a second wire for connecting at least one I/O cells of the third I/O cell group to the at least one I/O cells of the second I/O cell group.

14. The multichip module of claim 13, wherein the second semiconductor chip comprises a digital circuit.

15. The multichip module of claim 13, wherein the second semiconductor chip comprises a DRAM.

* * * * *